United States Patent [19]

Dobbs et al.

[11] Patent Number: 4,667,867

[45] Date of Patent: May 26, 1987

[54] WIRE BONDING TOOL

[75] Inventors: Robert J. Dobbs, Monroeton; Christopher A. Tarry, Sayre, both of Pa.

[73] Assignee: GTE Products Corporation, Stamford, Conn.

[21] Appl. No.: 880,965

[22] Filed: Jul. 1, 1986

[51] Int. Cl.⁴ .............................................. B23K 3/02
[52] U.S. Cl. ..................................... 228/44.7; 228/54; 76/101 D
[58] Field of Search ......................... 76/101 R, 101 D; 228/44.7, 4.5, 54, 51

[56] References Cited

U.S. PATENT DOCUMENTS

| 1,541,301 | 6/1925 | White | 228/54 |
| 2,140,910 | 12/1938 | Hensel et al. | 228/54 |
| 3,627,192 | 12/1971 | Killingsworth | 228/54 |
| 4,049,506 | 9/1977 | Gilding | 228/54 |

Primary Examiner—Roscoe V. Parker
Attorney, Agent, or Firm—Donald R. Castle

[57] ABSTRACT

A wire bonding tool is disclosed which comprises a metal or cermet stem and a silicon nitride containing tip. The tip is made of a silicon nitride containing composite which is electrically conducting. One end of the tip is fixedly mounted to one end of the stem.

8 Claims, 2 Drawing Figures

WIRE BONDING TOOL

BACKGROUND OF THE INVENTION

This invention relates to a wire bonding tool having a tip made of an electrically conducting silicon nitride containing composite and a metallic stem.

In the wire bonding industry, a wire bonding tool is used in an ultrasonic wire bonding machine, which, through this tool, imparts energy to the wire which is being bonded to a pad on a printed circuit chip.

The typical materials used for this application are cemented tungsten carbide or titanium metal. The advantage of silicon nitride is in its longer life and the superior bond strength realized in the wire to the pad joint. The toughness of silicon nitride is lower than that of the current materials which are used in bonding tools. Monolithic silicon nitride based bonding tools cannot withstand rough handling.

Therefore, it would be desirable to produce a bonding tool which has the long life characteristics of silicon nitride and the toughness of metallic material.

SUMMARY OF THE INVENTION

In accordance with one embodiment of the invention, there is provided a wire bonding tool which comprises a metal or cement stem and a silicon nitride containing tip. The tip is made of a silicon nitride containing composite which is electrically conducting. One end of the tip is fixedly mounted to one end of the stem.

DETAILED DESCRIPTION OF THE INVENTION

For a better understanding of the present invention, together with other and further objects, advantages and capabilities thereof, reference is made to the following disclosure and appended claims in connection with the above described drawings and description of some of the aspects of the invention.

Figure 1:
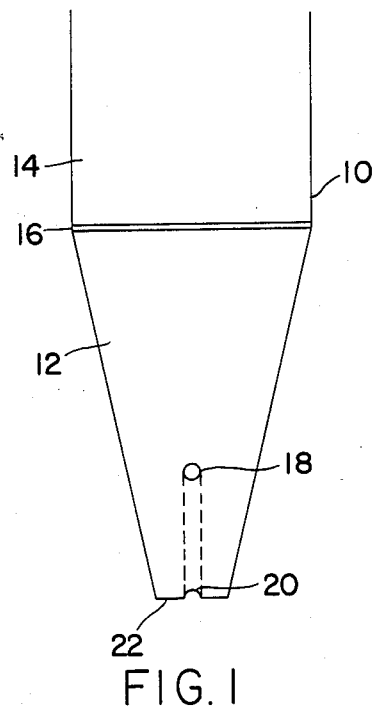
FIG. 1 is a drawing of a typical wire bonding tool of the present invention in which the tip is made of an electrically conducting silicon nitride containing composite material.

FIG. 1 is a drawing of a typical wire bonding tool (10) of this invention having a tip portion (12) and a stem portion (14). The tip and stem portions are joined together with a braze (16). Also shown is an opening (18) which has been machined through the tip through which the wire to be bonded is threaded. The wire passes through the opening and then through the groove (20) on the outer edge (22) of the tip. The machining of this opening is done by electrical discharge machining. This type of operation requires the silicon nitride containing composite to be electrically conducting.

Figure 2:
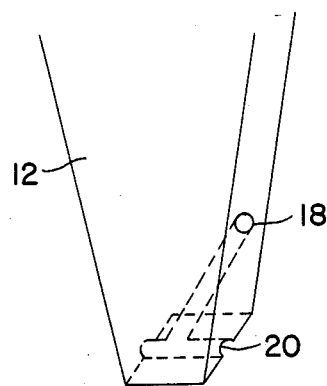
FIG. 2 is a drawing of the tip of the above described tool which is turned at a 90° angle from FIG. 1.

FIG. 2 shows the tip at a right angle to FIG. 1 showing the path of the opening through the tip to the outer groove.

The tool of this invention can be of any shape. The stem is typically cylindrical in shape. The body of the tip is typically cylindrical at the end which is joined to the stem, and then tapers to the tip.

The tool can be of any convenient size.

The stem is made of a material which can be a metal, a metal alloy, or cermet or combinations of these. The preferred materials are tungsten carbide with cobalt which is cemented tungsten carbide, and titanium metal. Especially preferred is cemented tungsten carbide. The material of the stem is tougher than the material of the tip.

The tip is made of a silicon nitride containing composite material which is electrically conducting. This material consists essentially of an electrically conducting ceramic phase and a silicon nitride phase. The electrically conducting phase can be any one or combination of titanium nitride, titanium carbide, zirconium nitride, zirconium carbide, hafnium nitride, hafnium carbide, vanadium nitride, vanadium carbide, niobium nitride, niobium carbide, tantalum nitride, tantalum carbide, and tungsten carbide. The electrically conducting phase is preferably from about 30% to about 50% by volume of the material of the tip. The preferred silicon nitride phases can be made of silicon nitride and other phases which are typically densification aids. The preferred silicon nitride phases are as follows in percent by weight: about 2%–5% aluminum oxide, about 6% yttrium oxide, about 0–8% aluminum nitride, and the balance silicon nitride.

Some preferred electrically conducting silicon nitride containing composites which can be formed from the above described conducting ceramics and silicon nitride based material are as follows in percent by weight: (1) about 39.4% titanium carbide, about 2.5% aluminum nitride, about 3.6% yttrium oxide, about 3.1% aluminum oxide, and the balance silicon nitride; (2) about 20.4% titanium nitride, about 19.7% titanium carbide, about 2.5% aluminum nitride, about 3.6% yttrium oxide, about 3.1% aluminum oxide, and the balance silicon nitride; and (3) about 61.1% titanium nitride, about 16% aluminum nitride, about 2.3% yttrium oxide, about 2.0% alumunum oxide, and the balance silicon nitride.

One end of the tip is fixedly mounted to one end of the stem preferably by means of a braze. Any braze can be used provided it effectively joins the tip to the stem. For example, when the stem is made of cemented tungsten carbide the especially preferred braze consists essentially of in percent by weight about 1.25% titanium, about 14.5% indium, about 23.5% copper, and the balance silver. This braze is supplied by WESGO Division of GTE Products Corporation under the trade name of "Incusil-15-ABA".

The combination of the silicon nitride and the tough material stem results in a wire bonding tool with improved toughness due to the stem material, and chemical inertness and improved wear properties due to the silicon nitride containing tip. The life of the bonding tool of this invention is about 10 times longer than the life of a tool which is made entirely of WC-Co. Furthermore, the chemical inertness of the silicon nitride is advantageous because in the bonding operation, the tool is not contaminated with metal from the wire which is being bonded such as by adhesion of the wire metal to the tool. The tool remains clean after bonding. Tool tips made of materials other than silicon nitride containing material are prone to "picking up" metal on their surfaces during the bonding process.

While there has been shown and described what are at present considered the preferred embodiments of the invention, it will be obvious to those skilled in the art that various changes and modifications may be made therein without departing from the scope of the invention as defined by the appended claims.

What is claimed is:

1. A wire bonding tool comprising a metal or cermet stem and a silicon nitride containing tip, said tip being made of silicon nitride containing composite which is electrically conducting, one end of said tip being fixedly mounted to one end of said stem.

2. A wire bonding tool of claim 1 wherein said tip is mounted to said stem by means of a braze.

3. A wire bonding tool of claim 1 wherein said silicon nitride containing composite consists essentially of a conductive ceramic phase and a silicon nitride based phase.

4. A wire bonding tool of claim 3 wherein said conductive ceramic phase is selected from the group consisting of titanium nitride, titanium carbide, zirconium nitride, zirconium carbide, hafnium nitride, hafnium carbide, vanadium nitride, vanadium carbide, niobium nitride, niobium carbide, tantalum nitride, tantalum carbide, tungsten carbide, and combinations thereof.

5. A wire bonding tool of claim 4 wherein said conductive phase makes up from about 30% to about 50% by volume of said tip.

6. A wire bonding tool of claim 1 wherein said stem is made of a material selected from the group consisting of metals, metal alloys, cermets, and combinations thereof.

7. A wire bonding tool of claim 6 wherein said material of said stem is selected from the group consisting of cemented tungsten carbide and titanium metal.

8. A wire bonding tool of claim 7 wherein said material of said stem is cemented tungsten carbide.

* * * * *